United States Patent
Chandhok et al.

(10) Patent No.: US 6,549,272 B1
(45) Date of Patent: *Apr. 15, 2003

(54) METHOD FOR IMPROVED RESOLUTION OF PATTERNING USING BINARY MASKS WITH PUPIL FILTERS

(75) Inventors: Manish Chandhok, Portland, OR (US); Brandon C. Barnett, Beaverton, OR (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/553,199

(22) Filed: Apr. 20, 2000

Related U.S. Application Data

(63) Continuation-in-part of application No. 09/527,377, filed on Mar. 16, 2000.

(51) Int. Cl.[7] ........................ G03B 27/54; G03B 27/42
(52) U.S. Cl. ........................................ 355/67; 355/53
(58) Field of Search .................. 355/53, 67, 68, 355/69, 77, 71; 430/5, 20, 22, 30, 311

(56) References Cited

U.S. PATENT DOCUMENTS

| | | | | |
|---|---|---|---|---|
| 5,610,684 A | * | 3/1997 | Shiraishi | 355/53 |
| 5,621,500 A | * | 4/1997 | Shiraishi | 355/53 |
| 5,636,004 A | * | 6/1997 | Ootaka et al. | 355/53 |
| 5,863,712 A | * | 1/1999 | Von Bunau et al. | 355/53 |
| 6,151,103 A | * | 11/2000 | Shu et al. | 355/53 |
| 6,261,727 B1 | * | 7/2001 | Wang | 355/55 |
| 6,304,317 B1 | * | 10/2001 | Taniguchi et al. | 355/53 |
| 6,320,648 B1 | * | 11/2001 | Brueck et al. | 355/53 |

\* cited by examiner

*Primary Examiner*—Alan A. Mathews
(74) *Attorney, Agent, or Firm*—Blakely, Sokoloff, Taylor & Zafman LLP

(57) ABSTRACT

A photolithography lens system is disclosed. The system has several elements perpendicularly aligned to an optical axis. The elements include a light source that generates an exposing light, a first lens that has a front focal plane and a pupil plane, and a binary mask between the light source and the first lens. The binary mask is placed at the front focal plane of the first lens. A pupil filter is placed at the pupil plane. Finally, a second lens is provided that has a front focal plane at substantially the same position as the pupil plane. The second lens also has a back focal plane where a semiconductor wafer is placed.

10 Claims, 3 Drawing Sheets

PUPIL FILTER DIAGRAM

METHOD FOR IMPROVED RESOLUTION OF PATTERNING USING BINARY MASKS WITH PUPIL FILTERS

RELATED APPLICATIONS

This is a continuation-in-part of U.S. patent application Ser. No. 09/527,377 entitled "Method for Improved Resolution of Patterning Using Binary Masks with Pupil Filters" filed on Mar. 16, 2000, now pending.

FIELD OF THE INVENTION

The present invention relates to photolithography, and more particularly, to the use of a pupil filter in conjunction with a binary mask to improve resolution.

BACKGROUND INFORMATION

Photolithography is commonly used in a manufacturing process to form patterns on a layer of photoresist. In the photolithography process, a photoresist layer is deposited over an underlying layer that is to be etched. Typically, the underlying layer is a semiconductor layer, but may be any type of substrate material. The photoresist layer is then selectively exposed to radiation through a mask. The photoresist is then developed and those portions of the photoresist that are exposed to the radiation are removed, in the case of "positive" photoresist.

The mask used to pattern the wafer is placed within a photolithography exposure tool, commonly known as a "stepper". In the stepper machine, the mask is placed between the radiation source and the wafer. The mask is typically formed from patterned chromium placed on a quartz substrate. The radiation passes through the quartz sections of the mask where there is no chromium substantially unattenuated. In contrast, the radiation does not pass through the chromium portions of the mask. Because radiation incident on the mask either completely passes through the quartz sections or is completely blocked by the chromium sections, this type of mask is referred to as a binary mask. After the radiation selectively passes through the mask, the pattern on the mask is transferred onto the photoresist by projecting an image of the mask onto the photoresist through a series of lenses.

As features on the mask become closer and closer together, diffraction effects begin to take effect when the size of the features on the mask are comparable to the wavelength of the light source. Diffraction blurs the image projected onto the photoresist, resulting in poor resolution.

One prior art method of preventing diffraction patterns from interfering with the desired patterning of the photoresist is to cover selected openings in the mask with a transparent layer that shifts one of the sets of exposing rays out of phase, which will null the interference pattern from diffraction. This approach is referred to as a phase shift mask (PSM). Nevertheless, use of the phase shift mask has several disadvantages. First, the design of a phase shift mask is a relatively complicated procedure that requires significant resources. Secondly, because of the nature of a phase shift mask, it is difficult to check whether or not defects are present in the phase shift mask.

Another prior art approach is to use attenuated phase shift masks (AttPSM) to enhance resolution. The AttPSM has "leaky" chrome features that are partially transmitting. Additionally, the light in the quartz region is phase shifted by 180 degrees. The attenuated phase shift mask operates by attenuating the zero order of light. However, one disadvantage of attenuated phase shift masks is their cost of manufacture. Additionally, it has been found that attenuated phase shift masks can create an undesirable resist loss at the side lobes of the contacts. The diffraction pattern of a square contact at the wafer, known as the Airy disk, consists of a main central intensity peak and smaller secondary peaks that are offset from the main peak. When using AttPSM, these secondary peaks are in phase with the background electromagnetic field. The intensity resulting from the constructive interaction can be sufficient to expose the resist, creating the undesired features known as side lobes.

BRIEF DESCRIPTION OF DRAWINGS

The present invention will be described in conjunction with the following drawings, wherein.

DETAILED DESCRIPTION OF THE INVENTION

The present invention uses a first focusing lens, a pupil filter, and a second focusing lens to produce an image of a binary mask pattern with sharper defined edges on a semiconductor wafer. The preferred embodiment of the present invention is described in connection with the patterning of a photoresist layer formed on a semiconductor wafer. However, it can be appreciated that the photoresist layer may be formed on any type of substrate, including but not limited to, insulative or conductive substrates. Thus, the present invention can be used with any substrate having photoresist thereon. Additionally, the term "binary mask" refers to those masks that only have regions that are substantially opaque and regions that are substantially transmissive.

The light emitting from a light source passes though the binary mask, the first lens, the pupil filter, and the second lens, and then projects an image of the binary mask pattern onto the semiconductor wafer. The first lens produces a Fourier-transformed image of the mask pattern. The pupil filter selectively adjusts the amplitude of the Fourier-transformed image to produce an "attenuated Fourier-transformed" image. The second lens produces an inverse-Fourier transformed image of the attenuated Fourier-transformed image, which is then projected onto the wafer. As will be described below in more detail, the inverse-Fourier transform of the attenuated Fourier-transformed image is an accurate replica of the original mask pattern with sharply defined edges.

When the openings of a mask that defines the mask pattern have dimensions comparable to the wavelength of the light source, diffraction will occur when the light passes through the openings on the mask and onto the wafer. One example of such an opening is a contact hole, which is square on the mask, but due to diffraction, the image of the opening formed on the wafer is blurred at the edges and prints as a round feature. The light intensity will be higher near the center of the slit image, decreasing gradually at the edges. Thus, the boundaries of the image of the opening at the wafer will not be clearly defined.

Fourier Analysis

Figure 1:
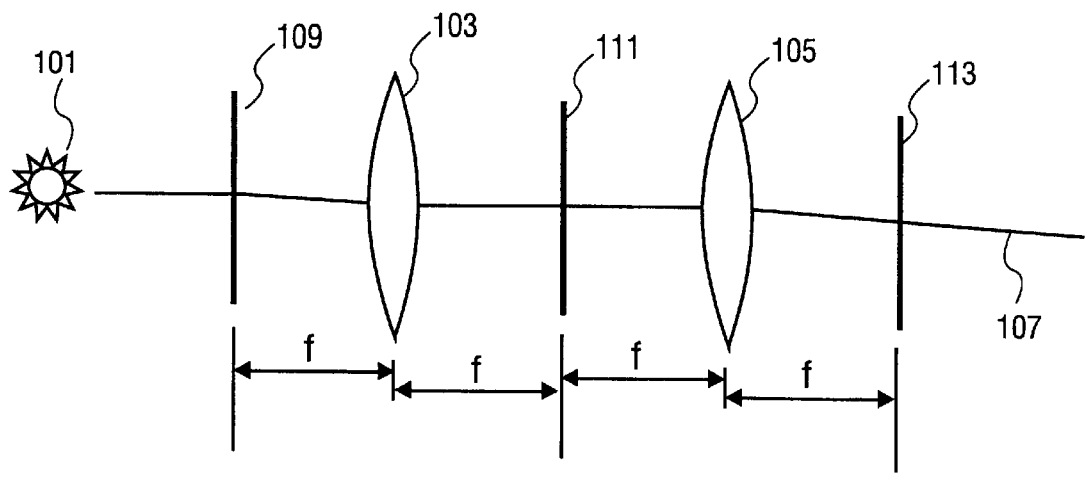
FIG. 1 is a schematic diagram of a prior art lens system for exposing a semiconductor wafer during photolithography.

Referring to FIG. 1, a light source 101, a first lens 103, and a second lens 105 are aligned along the optical axis 107 of the lenses 103 and 105. The focal lengths of the first lens 103 and the second lens 105 are both equal to f. An object plane 109 is situated at the front focal plane of the first lens 103. The front direction refers to the direction towards the light source 101. A pupil plane 111 is situated at the back focal plane of the first lens 103.

The pupil plane 111 is also situated at the front focal plane of the second lens 105. An image plane 113 is situated at the back focal plane of the second lens 105. As seen in FIG. 1, the distance between the object plane 109 and the center of the first lens 103 is f, the distance between the center of the first lens 103 and the pupil plane 111 is f, and the distance between the pupil plane 111 and the center of the second lens 105 is f. Finally, the distance between the center of the second lens 105 and the image plane 113 is also f.

For purpose of illustration, assume that the x-axis is the horizontal axis (in the direction into the Figure), the y-axis is the vertical axis, and the z-axis is the optical axis 107. A two-dimensional pattern u(x, y) is placed at the object plane 109. According to Fourier optics theory, the image formed at the pupil plane 111 is the two-dimensional Fourier transform of u(x, y), which is represented by U(fx, fy). The intensity, $U^2(fx,fy)$, is referred to as the Fraunhofer diffraction pattern. The symbols fx and fy represent the coordinates on the pupil plane 111. The relationship between the u(x, y) and U(fx, fy) can be written as (Eq. 1):

$$U(fx, fy)=F[u(x, y)]$$

The notation F[ ] represents the Fourier transform operator.

When the image U(fx, fy) passes through the second lens 105 and is projected on the image plane 113, the image at the image plane 113 will be the inverse-Fourier transform of the image formed at the pupil plane 111. If nothing is placed at the pupil plane 111 to alter the amplitude and phase of the image at pupil plane 111, then the image projected on the image plane 113 is nominally the original pattern u(x, y). This is because the inverse-Fourier transform of a Fourier-transformed image is the same image itself. This can be written as:

$$F^{-1}[F[u(x, y)]]=u(x, y)$$

The notation $F^{-1}$[ ] represents the inverse-Fourier transform operator. In reality, due to the finite size of lenses, not all of the diffraction orders (Fourier modes) in the pupil plane can be collected. Hence, the image does not exactly match the object.

Photolithography Using Pupil Filter in the Spatial Frequency Plane

Figure 2:
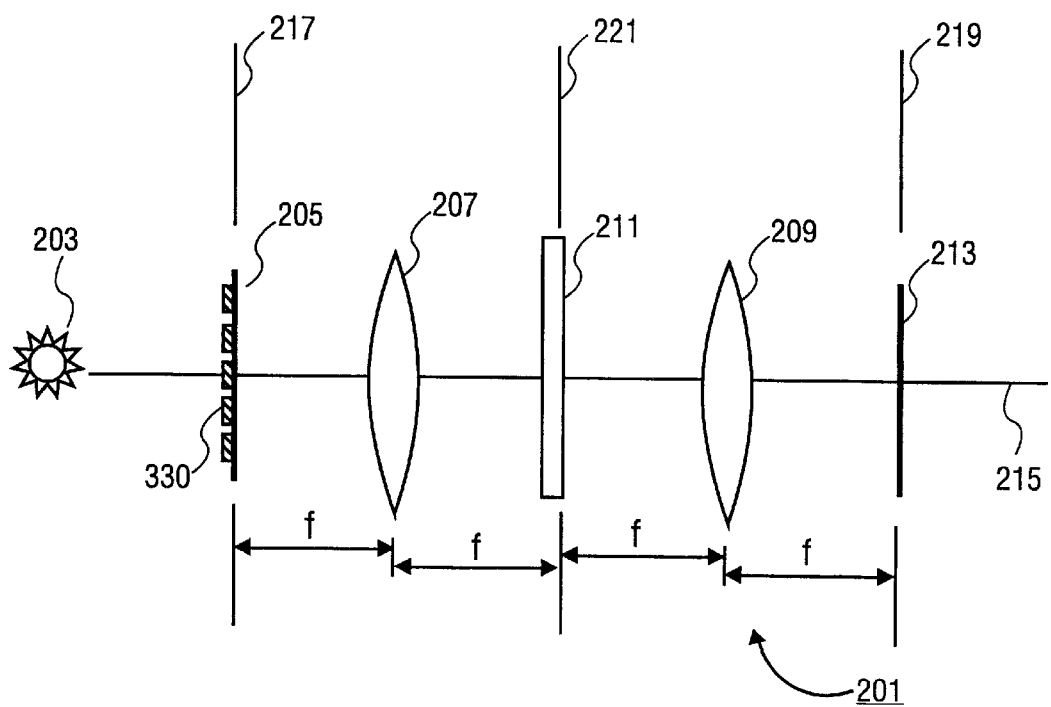
FIG. 2 is a schematic diagram of a lens system for exposing a semiconductor wafer during photolithography formed in accordance with the present invention.

Turning to FIG. 2, a schematic illustration of an embodiment of the present invention is shown. A photolithography system 201 includes a light source 203, a binary mask 205, a first lens 207, a pupil filter 211, a second lens 209, and a wafer 213 that are all aligned along the optical axis 215. The mask 205, first lens 207, pupil filter 211, second lens 209, and the wafer 213 are placed perpendicularly to the optical axis 215.

Although preferably the mask 205, first lens 207, pupil filter 211, second lens 209, and wafer 213 are perpendicular, it can be appreciated that these elements may not be exactly aligned perpendicularly to the optical axis 215 due to manufacturing or implementation tolerances. Therefore, the term perpendicular as used herein shall mean substantially perpendicular within normal manufacturing or implementation tolerances.

The light source 203 is typically an ultraviolet (UV) or deep ultraviolet (DUV) light source, although it may be any type of radiation source normally used in photolithography. An example of the light source 203 is a KrF laser emitting DUV radiation with a wavelength of 248 nm. All components of FIG. 3, except for existence and placement of the pupil filter 211, are of conventional design for many photolithography stepper machines.

The binary mask 205 is typically formed of deposited chromium on quartz in accordance with conventional techniques. The binary mask 205 carries a mask pattern 330 that is to be imprinted onto the wafer. The wafer 213 is typically coated with a photoresist layer, so that after the photolithography process, a replica of the mask pattern 330 is formed on the photoresist layer on the wafer 213. The binary mask 205, the first lens 207, the pupil filter 211, the second lens 209, and the wafer 213 are mounted on a support frame of the photolithographic machine that is not shown in the FIG. 2.

The focal length of the first lens 207 and the second lens 209 are equal to f. The binary mask 205 is situated between the light source 203 and the first lens 207. The first lens 207 has two focal planes. The front focal plane 217 of the first lens 207 is defined to be the one that is closer to the light source 203, and the back focal plane is defined to be the one that is farther away from the light source 203. Likewise, the second lens 209 has two focal planes. The front focal plane of the second lens 209 is defined as the one that is closer to the light source 203, and the back focal plane 219 is defined as the one that is farther away from the light source 203. In this embodiment, the back focal plane of the first lens 207 coincides with the front focal plane of the second lens 209, and is called the pupil plane 221. This is because the image formed at the back focal plane of the first lens 207 is the Fourier transform of the image at the front focal plane 217.

In operation, light from the light source 203 passes through the binary mask 205, passes through the first lens 207, the pupil filter 211, the second lens 209, and then projects an image upon the wafer 213. The first and second lenses 207 and 209 are conventional focusing optical lenses commonly used in many of the photolithography machines. The center of the pupil filter 211 is situated at the pupil plane 221. The wafer 213 is situated at the back focal plane 219 of the second lens 209.

Preferably, the pupil filter 211 is formed using conventional techniques. For example, the paper "Optimization of Pupil Filters for Increased Depth of Focus", by von Bunau et al., Jpn. J. Appl. Phys., Vol. 32 (1993) pp. 5350–5355 discusses various methods of manufacturing pupil filters. Specifically, for a circularly symmetric transmission pattern, as discussed in the von Bunau paper, one method is to evaporate a metal film through a stencil mask onto a rotating substrate.

Being located at the pupil plane 221, the pupil filter 211 acts directly on the spectral components of the image of the binary mask 205 to redistribute the relative intensities of the diffraction orders. Specifically, the pupil filter 211 acts to suppress the zero and first order of light emerging from said binary mask 205. The present invention attempts to emulate the effect of an attenuated phase shift mask, without the cost and other disadvantages of the attenuated phase shift mask.

Thus, the pupil filter 211 working in conjunction with the binary mask 205 should have the same effect as an "attenuated phase shift mask version" of the binary mask 205. In other words, the pupil filter 211 and the binary mask 205 should be equivalent to the binary mask 205 converted using conventional techniques into an attenuated phase shift mask. In mathematical terms:

[Binary Mask]×[Pupil Filter]=AttPSM or

Pupil Filter=AttPSM/[Binary Mask]

From the above equation, the design of the pupil filter 211 requires the analysis of the Fraunhofer diffraction pattern of the binary mask and the AttPSM. The following expression gives the electromagnetic field at the pupil plane 221 of a single slit of width "2a" for a conventional binary mask, mask transmission function F(x)=2a, $U(p)=C_1 \int F(x)e^{-ikpx}dx = C_1 \times 2a \sin c(kpa)$, where $\sin c(\xi) = \sin(\xi)/\xi$, $k=2\pi/\lambda$, and $p=\xi NA/f$ (NA= Numerical aperture of the lens, f=focal length).

Figure 5:
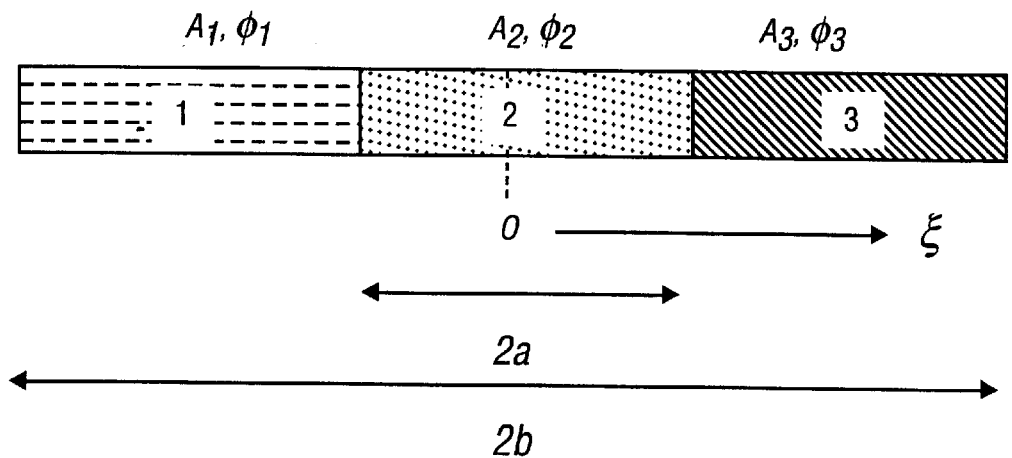
FIG. 5 is a schematic illustration of a three slit pattern.

For AttPSM, the analysis is extended for a repeated 3 slit pattern whose transmission amplitude and phase are given by $A_{1-3}$ and $\phi_{1-3}$, respectively. The width of the center slit is 2a and the widths of the adjacent slits are (b−a) (see FIG. 5). Thus, $$U(P) = C_1 \begin{bmatrix} (b-a)A_1 e^{i\phi_1} e^{ikp\left(\frac{a+b}{2}\right)} \sin c(kp(b-a)/2) + \\ 2aA_2 e^{i\phi_2} \sin c(kpa) + \\ (b-a)A_3 e^{i\phi_3} e^{-ikp\left(\frac{a+b}{2}\right)} \sin c(kp(b-a)/2) \end{bmatrix}$$

For AttPSM, $A_1=A_3$, $\phi_1=\phi_3=\pi(180°)$, $A_2=1$, $\phi_2=0$. Hence, the above expression can be simplified to give the electromagnetic field of the diffracted mask pattern at the pupil plane 221 as a function of mask parameters: pitch (2b), feature size (2a), background transmission amplitude $A_1$, and the exposure wavelength ( ).

AttPSM $U(P)=C_1 \times [2a \sin c(kpa) - 2(b-a)A_1 \sin c(kp(b-a)/2)\cos(kp(a+b)/2)]$ Using the above equations, the pupil filter 211 to be used with binary mask 205 to give a diffraction pattern that closely approximates the attenuated phase shift mask version of the binary mask 205 can be obtained explicitly in terms of mask and stepper parameters as:

[Binary Mask]×[Pupil Filter]=AttPSM or

Pupil Filter=AttPSM/[Binary Mask]

∴ Pupil Filter=1−{[2(b−a)$A_1$ sin c(kp(b−a)/2)cos(kp(a+b)/2)]/2a sin c(kpa)}

Figure 6:
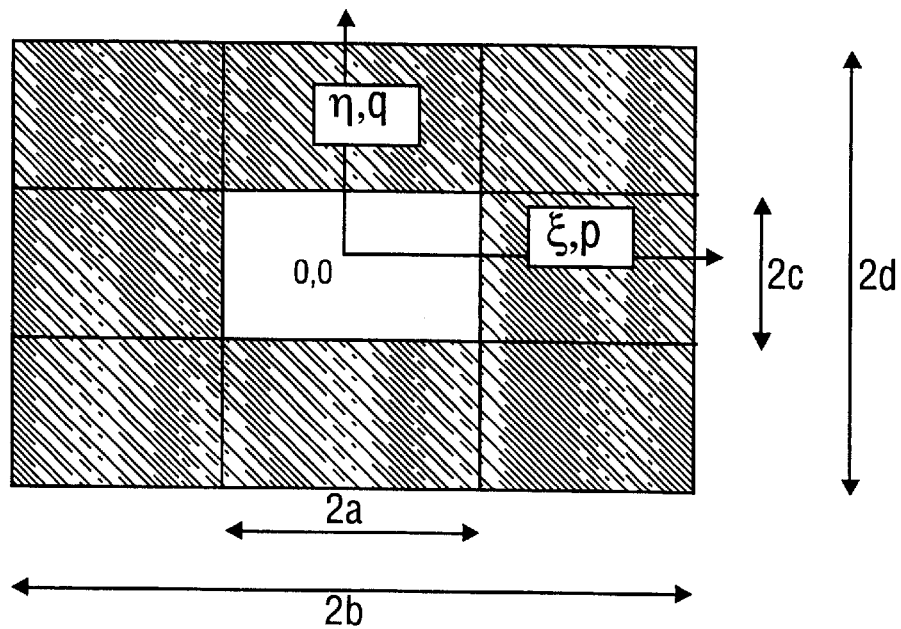
FIG. 6 is a schematic illustration of a two-dimensional hole pattern.

For a two dimensional (holes instead of slits) representation of the AttPSM (as shown in FIG. 6), the electromagnetic field is given by:

$U(P)=C_1\{2c \sin c(kqc)[2a \sin c(kpa)-2(b-a)A_1 \sin c(kp(b-a)/2)\cos(kp(a+b)/2)]-2b \sin c(kpb)[A_1 2(d-c)\sin c(kq(d-c)/2)\cos(kq(c+d)/2)]\}$ Hence, the equivalent pupil filter is 2a sin c(kpa)2c sin c(kqc)×PF={2c sin c(kqc)[2a sin c(kpa)−2(b−a)$A_1$ sin c(kp(b−a)/2)cos(kp(a+b)/2)]−
2b sin c(kpb)[$A_1$2(d−c)sin c(kq(d−c)/2)cos(kq(c+d)/2)]}

$$\therefore PF = 1 - \left[A_1 \frac{(b-a)}{a} \times \frac{\sin c(kp(b-a)/2)\cos(kp(a+b)/2)}{\sin c(kpa)}\right] - \left[\frac{A_1 b(d-c)}{ac} \times \frac{\sin c(kpb)\sin c(kq(d-c)/2)\cos(kq(c+d)/2)}{\sin c(kpa)\sin c(kqc)}\right]$$

Typically for contacts, c=a, and d=b. Therefore, $$\therefore PF = 1 - \left[A_1 \frac{(b-a)}{a} \times \frac{\sin c(kp(b-a)/2)\cos(kp(a+b)/2)}{\sin c(kpa)}\right] - \left[\frac{A_1 b(b-a)}{a^2} \times \frac{\sin c(kpb)\sin c(kq(b-a)/2)\cos(kq(a+b)/2)}{\sin c(kpa)\sin c(kqc)}\right]$$

This equation defines how the electromagnetic field of a conventional binary mask is modulated in the pupil plane when using AttPSM. The same field modulation can be achieved using a conventional binary mask and modulating the transmission and phase directly in the pupil plane through a pupil filter. The equation for PF defines the transmission and phase of the filter at all points (p,q) in the pupil plane to achieve the modulation imparted by the AttPSM.

Since the diffraction patterns of the mask pattern for the pupil filter and AttPSM are identical by design, the resolution enhancements to patterning are also identical. By substituting values for a (half width of feature), b (half period), and $A_1$ (transmission amplitude of the background) in the equation above for the pupil filter, a pupil filter equivalent to an AttPSM can be obtained. A variety of pupil filters can be designed for various combinations of a, b, and A1. This analytical technique gives a method of parameterizing the family of pupil filters to find an optimum for the desired configuration.

Using the above formula, it has been found that the PF for an isolated feature (b>>a) has a phase and transmittance variation. It is desirable to have a pupil filter without any phase change since phase defects add to lens aberrations and the filters are also difficult to manufacture. The pupil filter for a tightly nested feature where b~2a is a pure transmittance filter (no phase change) which results in resolution enhancement through the suppression of the zero order light. In some cases the absolute value of PF can be >1. This is not physically possible. PF is then scaled so that the maximum transmittance is 1. This will result in a difference in the peak image intensity for the binary mask+PF vs. the equivalent AttPSM which the PF was meant to mimic.

Figure 3:
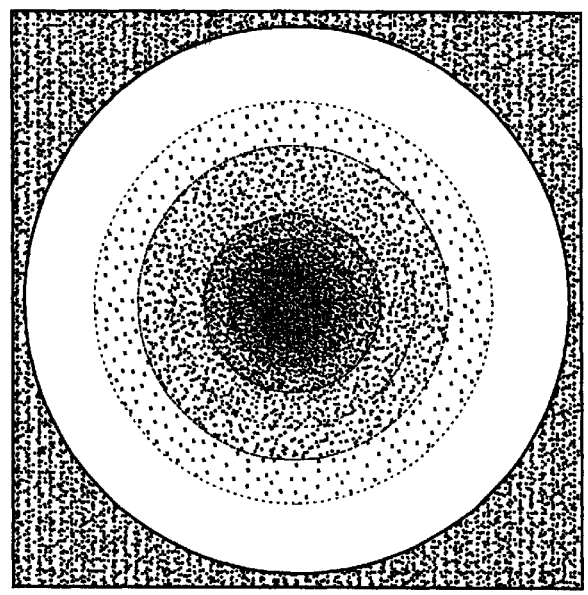
FIG. 3 is an illustration of a pupil filter formed in accordance with the present invention.
Figure 4:
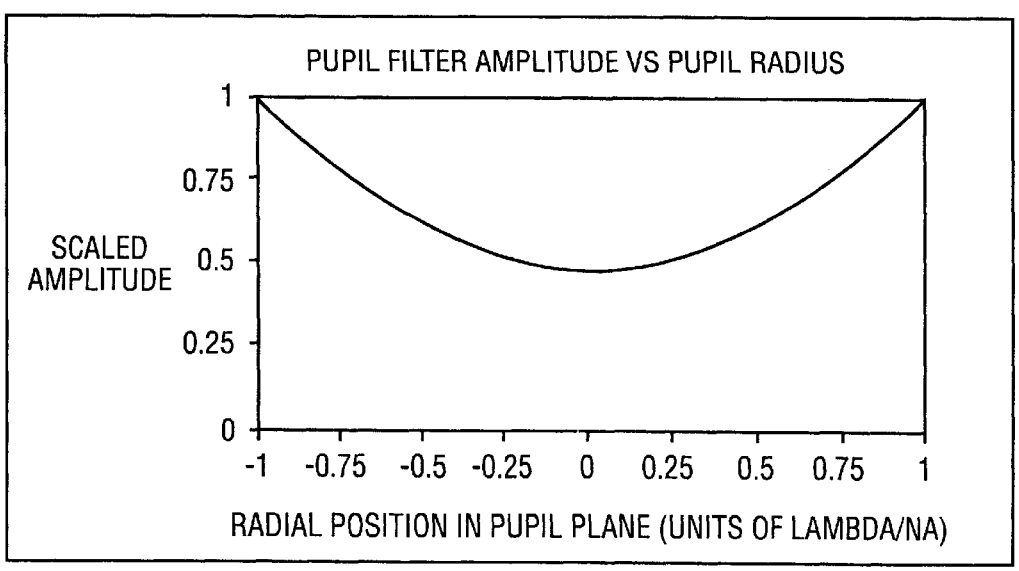
FIG. 4 is a graph of the transmissivity characteristics of the pupil filter of FIG. 3.

FIG. 3 illustrates an exemplary pupil filter 211 formed in accordance with the present invention. FIG. 4 shows a graph illustrating the transmissivity of the pupil filter 211 relative to radial position off of the optical axis 215. As can be seen, the central area of the pupil filter 211 is more opaque to the irradiating light than the periphery. In FIG. 4, the radial position is measured in units of λ/NA, where NA is the numerical aperture of the first lens 207. The amplitude scale of FIG. 4 is scaled to have a value of 1.0 for complete transmissivity and 0.0 for complete opaqueness. The graph of FIG. 4 is taken directly from calculated data where $A_1$=0.4242 (18% transmission intensity), b=110 nm, a=55 nm. The image produced at the back focal plane of the first lens 207 is the Fourier transform of the image at the front focal plane 217. Assuming that the thickness of the pupil filter 211 is small compared with the focal length f, the image projected onto the front end of the pupil filter 211 is the Fourier-transformed image of the mask pattern of the binary mask 205. The pupil filter 211 selectively changes the amplitude of the Fourier-transformed image, and produces an "attenuated Fourier-transformed" image of the mask pattern. The image formed on the back focal plane 219 of the second lens 209 is the inverse-Fourier transform of the image at the front focal plane of the second lens 209. Thus, the image projected onto the wafer 213 is the inverse-Fourier transform of the attenuated Fourier-transformed image of the mask pattern.

Assume the mask 205 has a two-dimensional mask pattern 330 that is described as u(x, y). The image u(x, y) is situated at the front focal plane 217 of the first lens 207. The Fourier-transformed image at the front end of the pupil filter 211 is $U_0(f_x, f_y)$, where fx, fy are the coordinates on the spatial frequency plane. The image formed after passing through the pupil filter 211 is $U_1$(fx, fy).

The pupil filter 211 is near the front focal plane of the second lens 209 (under the assumption that the thickness of the pupil filter 211 is small compared with the focal length f). The image projected on the back focal plane 219 is the inverse Fourier transform of the image at the front focal plane of the second lens 209. Therefore, the combination of the first lens 207, pupil filter 211, and second lens 209 has the effect of transferring the image of the mask pattern 330 onto the wafer 213 with the edges more sharply defined. The blurring due to diffraction is reduced accordingly.

The above description of illustrated embodiments of the invention is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. An apparatus comprising:
   a light source;
   a first lens placed perpendicular to an optical axis, said first lens having a front focal plane and a pupil plane;
   a binary mask placed perpendicular to said optical axis and between said light source and said first lens, said binary mask placed at said front focal plane of said first lens;
   a pupil filter placed perpendicular to said optical axis and at said pupil plane, said pupil filter formed in accordance with:

Pupil Filter=1−{[2(b−a)A₁ sin c(kp(b−a)/2)cos(kp(a+b)/2)]/2a sin c(kpa)}, where
   $A_1$ is the transmission amplitude of said binary mask, $\lambda$ is the wavelength of said exposing light, k=2Π/λ, a is one-half of a feature size of said binary mask, p is the pitch of said binary mask, and b=p/2;
   a second lens placed perpendicular to said optical axis, said second lens having a front focal plane at substantially the same position as said pupil plane, said second lens also having a back focal plane; and
   a substrate having photoresist thereon placed at the back focal plane of said second lens.

2. The apparatus of claim 1 wherein the distance between said pupil filter and said first lens is substantially equal to the focal length of said first lens, and the distance between said pupil filter and said second lens is substantially equal to the focal length of said second lens.

3. The apparatus of claim 1 wherein said pupil filter suppresses the zero order of light passing through said binary mask.

4. An apparatus comprising:
   a light source that generates an exposing light;
   a first lens placed perpendicular to an optical axis, said first lens having a front focal plane and a pupil plane;
   a binary mask placed perpendicular to said optical axis and between said light source and said first lens, said binary mask placed at said front focal plane of said first lens;
   a pupil filter placed perpendicular to said optical axis and at said pupil plane, said pupil filter formed such that the combination of said pupil filter, said first lens, and said binary mask modify said exposing light to emulate the effect of an attenuated phase shift mask version of said binary filter and said first lens acting on said exposing light, said pupil filter is formed in accordance with:

Pupil Filter=1−{[2(b−a)A₁ sin c(kp(b−a)/2)cos(kp(a+b)/2)]/2a sin c(kpa)}, where
   $A_1$ is the transmission amplitude of said binary mask, $\lambda$ is the wavelength of said exposing light, k=2Π/λ, a is one-half of a feature size of said binary mask, p is the pitch of said binary mask, and b=p2;
   a second lens placed perpendicular to said optical axis, said second lens having a front focal plane at substantially the same position as said pupil plane, said second lens also having a back focal plane; and
   a substrate having photoresist thereon placed at the back focal plane of said second lens.

5. The apparatus of claim 4 wherein said pupil filter to suppresses the zero order of light passing through said binary mask.

6. The apparatus of claim 4 wherein the distance between said pupil filter and said first lens is substantially equal to the focal length of said first lens, and the distance between said pupil filter and said second lens is substantially equal to the focal length of said second lens.

7. A method comprising:
   forming a pupil filter in accordance with:

Pupil Filter=1−{[2(b−a)A₁ sin c(kp(b−a)/2)cos(kp(a+b)/2)]/2a sin c(kpa)}, where
   $A_1$ is the transmission amplitude of said binary mask, $\lambda$ is the wavelength of said exposing light, k=2Π/λ, a is one-half of a feature size of said binary mask, p is the pitch of said binary mask, and b=p/2;
   placing a lens having a front focal plane and an image plane such that the front focal plane substantially coincides with said pupil plane; and
   placing a substrate having a photoresist thereon at said image plane.

8. The method of claim 7 further comprising placing said pupil filter at the pupil plane of a second lens.

9. The method of claim 8 further comprising placing a binary mask at front focal plane of said second lens.

10. The method of claim 9 further comprising providing incident light onto said binary mask such that said incident light is selectively passed through said binary mask, said second lens, and said pupil filter.

* * * * *